(12) United States Patent
Koyata et al.

(10) Patent No.: US 7,851,375 B2
(45) Date of Patent: Dec. 14, 2010

(54) ALKALINE ETCHANT FOR CONTROLLING SURFACE ROUGHNESS OF SEMICONDUCTOR WAFER

(75) Inventors: Sakae Koyata, Tokyo (JP); Kazushige Takaishi, Tokyo (JP)

(73) Assignee: Sumco Corporation, Tokyo (JP)

( * ) Notice: Subject to any disclaimer, the term of this patent is extended or adjusted under 35 U.S.C. 154(b) by 805 days.

(21) Appl. No.: 10/599,576

(22) PCT Filed: Mar. 25, 2005

(86) PCT No.: PCT/JP2005/005527

§ 371 (c)(1),
(2), (4) Date: Jul. 31, 2007

(87) PCT Pub. No.: WO2005/098921

PCT Pub. Date: Oct. 20, 2005

(65) Prior Publication Data

US 2007/0298618 A1    Dec. 27, 2007

(30) Foreign Application Priority Data

Apr. 2, 2004  (JP) .............................. 2004-109870

(51) Int. Cl.
H01L 21/302 (2006.01)

(52) U.S. Cl. ...................... 438/753; 438/745; 438/750; 216/90

(58) Field of Classification Search ................ 252/79.1, 252/2, 79.5; 438/745, 753, 750; 216/89, 216/90

See application file for complete search history.

(56) References Cited

U.S. PATENT DOCUMENTS

| | | | |
|---|---|---|---|
| 5,880,027 A | 3/1999 | Hajime et al. | |
| 6,099,748 A | 8/2000 | Netsu et al. | |
| 6,530,381 B1 | 3/2003 | Schwab et al. | |
| 7,338,904 B2 | 3/2008 | Koyata et al. | |
| 2004/0072437 A1 | 4/2004 | Iizuka et al. | |
| 2004/0108297 A1* | 6/2004 | Erk et al. ........................ | 216/2 |
| 2005/0139230 A1* | 6/2005 | Miyata et al. .................. | 134/2 |
| 2006/0240748 A1 | 10/2006 | Ohta et al. | |
| 2007/0184658 A1 | 8/2007 | Koyata et al. | |

FOREIGN PATENT DOCUMENTS

| | | |
|---|---|---|
| JP | 63-221967 | 9/1988 |
| JP | 7-037871 | 2/1995 |
| JP | 9-129624 | 5/1997 |
| JP | 9-270396 | 10/1997 |
| JP | 9-270397 | 10/1997 |
| JP | 9-306897 | 11/1997 |
| JP | 4-10110115 | 4/1998 |

(Continued)

OTHER PUBLICATIONS

English language abstract of JP 2003-229392 A.

(Continued)

*Primary Examiner*—Lan Vinh
(74) *Attorney, Agent, or Firm*—Greenblum & Bernstein, P.L.C.

(57) ABSTRACT

An alkali etchant for controlling surface roughness of a semiconductor wafer, which is a sodium hydroxide solution or a potassium hydroxide solution having a weight concentration of 55 wt % to 70 wt %.

4 Claims, 2 Drawing Sheets

FOREIGN PATENT DOCUMENTS

| | | |
|---|---|---|
| JP | 11-162953 | 6/1999 |
| JP | 11-171693 | 6/1999 |
| JP | 2001-185529 | 7/2001 |
| JP | 2002-203823 | 7/2002 |
| JP | 2002-203824 | 7/2002 |
| JP | 2003-7672 | 1/2003 |
| JP | 2003-229392 | 8/2003 |
| JP | 2004-262975 | 9/2004 |

OTHER PUBLICATIONS

English language abstract of JP 9-306897 A.
English language abstract of JP 63-221967 A.
English language abstract of JP 2001-185529 A.
English language abstract of JP 2002-203824 A.
English language abstract of JP 2003-7672 A.
English language abstract of JP 11-171693 A.
English language abstract of JP 11-162953 A.
U.S. Appl. No. 10/596,177, filed Jun. 2, 2006.
Japanese Office Action dated Aug. 18, 2009 that issued with respect to Japanese Patent Application No. 2005-022764, along with an English language translation.
Office Action mailed Apr. 21, 2010 with respect to U.S. Appl. No. 11/688,041.
Office Action mailed Nov. 6, 2009 with respect to U.S. Appl. No. 11/688,041.
Office Action mailed Jul. 12, 2010 with respect to U.S. Appl. No. 11/688,041.

* cited by examiner

ALKALINE ETCHANT FOR CONTROLLING SURFACE ROUGHNESS OF SEMICONDUCTOR WAFER

TECHNICAL FIELD

The present invention relates to an etchant (etching solution) for controlling surface roughness of a semiconductor wafer, and particularly relates to an etchant capable of suppressing deterioration of global flatness of a semiconductor wafer to lower the gloss level.

BACKGROUND ART

Chemical etching of a silicon wafer is performed for removing a damage layer (alteration layer due to processing) on a surface of the silicon wafer caused mainly by a mechanical processing step, such as block cutting, outer layer grinding, slicing and wrapping, and is also performed on the back surface in some cases, so that front and back of a silicon wafer, wherein both sides are mirror polished, can be identified.

In chemical etching for removing a damage layer, an acid etchant or an alkali etchant is used as the etchant. The former is an etchant formed by three components, wherein mixed acids of fluorinated acid (HF) and nitric acid ($HNO_3$) is diluted by water ($H_2O$) or by acetic acid ($CH_3COOH$). Silicon Si is oxidized by the nitric acid to generate $SiO_2$, then, the $SiO_2$ is dissolved by fluorinated acid and removed. The latter etchant is an etchant obtained by diluting potassium hydroxide (KOH) or caustic soda (NaOH), etc. by water. As a result of such chemical etching, a processing alteration layer of a silicon wafer is removed, so that the surface roughness is reduced and a smooth surface is obtained.

However, the conventional etchant as explained above has not been able to uniformly lower the gloss level of a mirror surface of a mirror finished silicon wafer while maintaining a global flatness level, for example, TTV (total thickness variation: a difference (μm) of a maximum value and a minimum value of wafer surface height when fixing the wafer back surface by suction; GBIR of the SEMI standard).

DISCLOSURE OF THE INVENTION

An object of the present invention is to provide an etchant capable of suppressing deterioration of a global flatness level and sufficiently lowering a gloss level of a wafer, and a production method of a semiconductor wafer.

To attain the above object, according to a first aspect of the present invention, there is provided an alkali etchant for controlling surface roughness of a semiconductor wafer, which is a sodium hydroxide solution having a weight concentration of 55 wt % to 70 wt %.

Also, to attain the above object, according to a second aspect of the present invention, there is provided a production method of a semiconductor wafer comprising the step of etching a main surface of a both-side mirror finished semiconductor wafer by bringing the main surface contact with a sodium hydroxide solution, wherein a temperature is 80° C. to 90° C. and weight concentration is 60 wt % to 70 wt %, or a sodium hydroxide solution, wherein a temperature is 85° C. to 90° C. and weight concentration is 55 wt % to 60 wt %.

In the present invention, a mirror surface of a wafer is etched by using an alkali etchant having an anisotropic etching property, that an etching speed in the depth direction is larger than that in the horizontal direction. Therefore, the etching speed is slow, yet roughness of the surface can be increased, consequently, deterioration of the global flatness level can be suppressed. Furthermore, at this time, the gloss level can be lowered by setting weight concentration of sodium hydroxide or potassium hydroxide to 55 wt % to 70 wt %.

BEST MODE FOR CARRYING OUT THE INVENTION

Below, an embodiment of the present invention will be explained based on the drawings.

Figure 1:
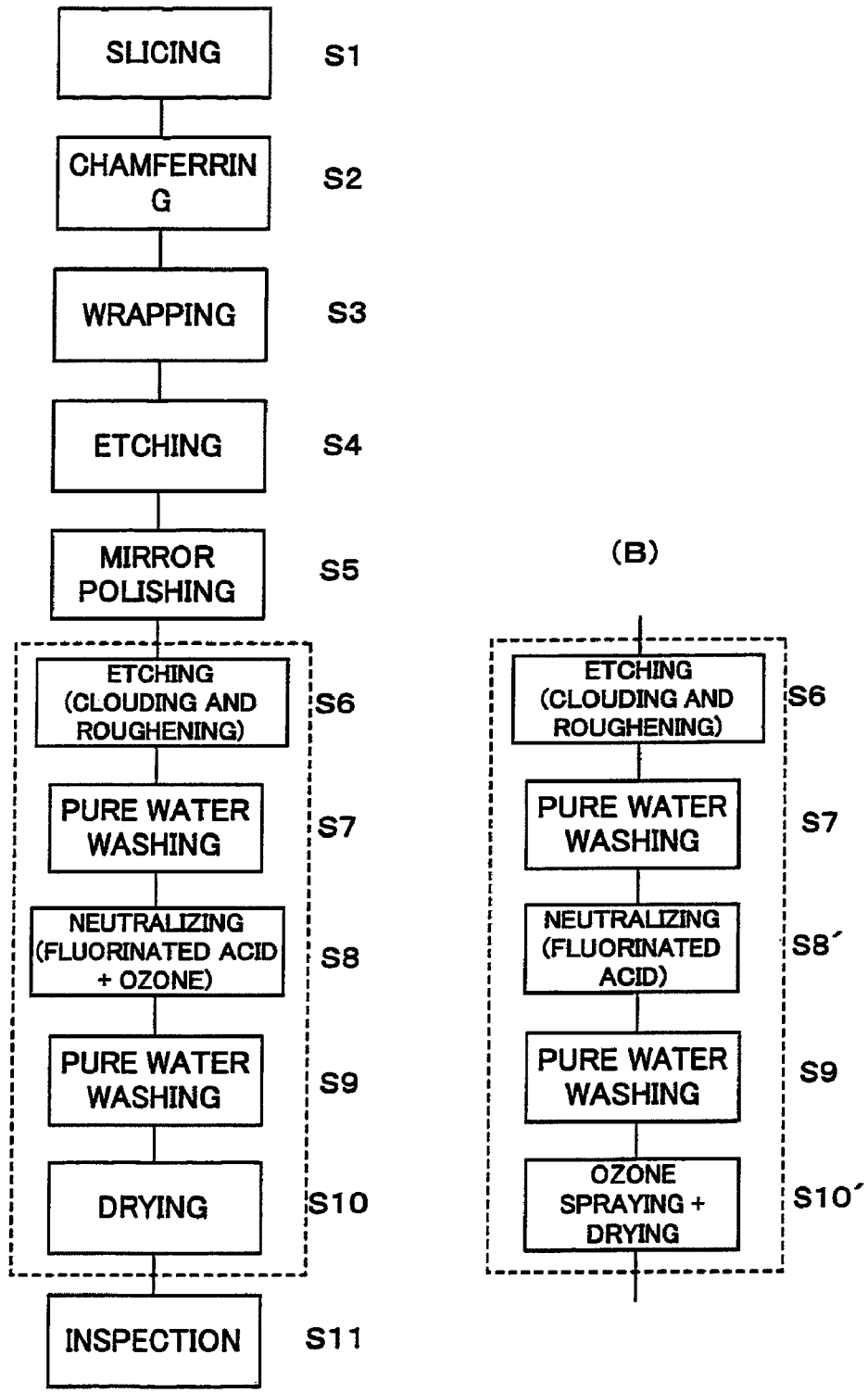
FIG. 1 (A) is a view of a procedure showing a production method of a semiconductor wafer according to an embodiment of the present invention, (B) is a view of a procedure of a key part showing a production method of a semiconductor wafer according to another embodiment.

First, to explain a production method of a semiconductor wafer according to the present embodiment with reference to FIG. 1(A), in wafer processing of this example, a silicon wafer is produced through steps of slicing, chamfering, etching, mirror polishing, etching (clouding or roughening processing), pure water washing, neutralizing, pure water washing, drying and inspection. Below, the respective steps will be explained in detail.

A silicon ingot grown by the CZ method is sliced to, for example, an 8-inch silicon wafer having a thickness of 860 μm or so in a slicing step in a step S1. Next, edges of the sliced silicon wafer is chamfered to be a predetermined shape by a chamfering grind stone in a chamfering step in a step S2. As a result, edges of the silicon wafer are shaped to be rounded as prescribed (for example, a MOS type chamfered shape). Then, the chamfered silicon wafer is wrapped by a wrapping step in a step S3. In the wrapping step, the silicon wafer is placed between a pair of wrapping boards being in parallel with each other, then, a mixture of alumina abrasive grains, and a dispersant and water is poured as a wrapping solution between the wrapping boards, and rotation and rubbing are performed under applying a pressure, so that both of the front and back surfaces of the wafer are mechanically wrapped. At this time, a wrapping amount of the silicon wafer is, for example, 30 to 80 μm or so for both of the back and front surfaces of the wafer.

Next, in a step S4, the wrapped wafer after the wrapping is etched. Specifically, by immersing the silicon wafer in a mixed acid solution obtained by mixing fluorinated acid and nitric acid (from normal temperature to 50° C.), etching of, for example, 20 μm for one surface and 40 μm or so for both surfaces is performed. As a result, distortion in the wrapping step and distortion in the chamfering step, etc. are removed.

Next, both surfaces of the silicon wafer are mirror polished in a step S5. This step is performed by using a polishing apparatus having a rotating upper polishing board and a rotating lower polishing board arranged to face to each other. A polishing cloth is attached to each of the upper polishing board and the lower polishing board, and the silicon wafer is pressed against the upper and lower polishing cloth, so that the both surfaces are mirror polished at a time. A polishing allowance at this time is, for example, 10 μm. Predetermined slurry is supplied when performing the mirror polishing.

When the mirror polishing finishes, the silicon wafer is taken out from the polishing apparatus and, in a step S6, clouding processing is performed by etching only the back surface of the wafer, wherein both surfaces are mirror finished. At this time, the alkali etchant according to the present invention is used.

The alkali etchant according to the present embodiment is for enabling easier identification of front and back with eyes by lowering a gloss level of the back surface of the wafer and has a characteristic of reducing gloss without deteriorating global flatness level of the back surface.

As an alkali etchant according to the present embodiment, a solution including sodium hydroxide NaOH as the main component, wherein weight concentration (volume mole concentration) of sodium hydroxide is 55 wt % (22.3 mol/L) to 70 wt % (31.3 mol/L), may be selected. When the weight concentration of the sodium hydroxide is lower than 55 wt %, etching progresses, but reducing of the gloss is not observed and identification of front and back surfaces with eyes becomes impossible. Also, an etchant including sodium hydroxide having weight concentration of exceeding 70 wt % is not suitable in terms of an etching processing temperature because it does not dissolve unless a temperature of the etchant is heightened to 100° C. or so.

Note that since solubility of sodium hydroxide to water is 50 wt % or so at a normal temperature, a temperature of the etchant is set to 80° C. to 90° C. in the etching step in the step S6. In the etching step in the step S6, a back surface of the wafer to be subjected to clouding processing is etched, for example, by 20 to 30 μm.

In the etching step in the step S6, a potassium hydroxide solution may be also used instead of the sodium hydroxide solution. When using a potassium hydroxide solution, if a potassium hydroxide solution having a volume mole concentration in the same range as that of the volume mole concentration of the sodium hydroxide solution explained above is used, the same etching effect as that obtained by the sodium hydroxide solution is obtained. Note that when comparing a sodium hydroxide solution with a potassium hydroxide solution having the same volume mole concentration, the potassium hydroxide has a larger molecular weight, so that an absolute value in a weight concentration range also becomes large and it becomes harder to obtain a solution thereof. Accordingly, a sodium hydroxide solution is preferably used as an alkali etchant in a point that it is easily made to be a solution.

When alkali etching is finished, the wafer is washed by immersing it in pure water or by spraying pure water thereon (pure water washing in a step S7), and neutralizing processing is performed for neutralizing the residual alkali etching solution on the wafer (a step S8). In the neutralization processing, the wafer is immersed in a fluorinated acid solution in a weight concentration of 10 wt % or lower at a normal temperature for 5 minutes. At this time, by adding ozone to the fluorinated acid solution, an oxidization film is formed on the wafer surface. Due to this, the silicon wafer surface is not exposed and it is possible to prevent contamination by metal impurities and adhesion of particles.

When the neutralizing processing finishes, the wafer attached with a fluorinated acid solution is washed by immersing it in pure water or spraying pure water thereon (pure water washing in the step S9) and, after that, spin drying, for example, at a rotation speed of 1500 rpm is performed for 120 seconds to dry the wafer (a step S10).

When the above steps finish, wafer flatness level is inspected in a step S11. In the inspection, for example, a flatness measurement device having a capacitance type distance sensor is used and, for example, wafers having GBIR (TTV) of 1.5 μm or less is determined to have a flatness level and those which do not satisfy that are determined to be defective in the flatness level.

Note that, in the steps S8 to S10 explained above, ozone was added to the fluorinated acid solution in the step S8 for forming an oxidization film on the wafer surface, however, as shown in a step S8' in FIG. 1(B), a fluorinated acid solution not added with ozone may be used in the neutralizing step and, for example, an ozone solution of 10 ppm or more may be sprayed on the wafer immediately before the spin drying in a step S10'.

EXAMPLES

Below, further detailed examples of the present invention will be explained.

Example 1

While keeping a 51 wt % of sodium hydroxide solution at 90° C., sodium hydroxide flakes having a purity of 99% were added thereto, so that an alkali etchant composed of a sodium hydroxide solution having weight concentration of 70 wt % was fabricated. In the alkali etchant kept at 90° C., one surface of a both-side mirror finished silicon wafer subjected to the processing in the steps S1 to S5 shown in FIG. 1 was immersed until an etching depth (allowance) reaches 30 μm. The wafer, wherein one surface was subjected to clouding processing as above, was subjected to pure water washing, neutralizing processing, pure water washing and drying in respective steps of the steps S7 to S10 shown in FIG. 1. As a neutralizing agent in the step S8, a fluorinated acid solution in weight concentration of 10 wt % added with 10 ppm of ozone was used and the processing was performed at a room temperature for 5 minutes.

Example 2

Other than fabricating an alkali etchant composed of a sodium hydroxide solution having weight concentration of 70 wt % by keeping 51 wt % of a sodium hydroxide solution at 85° C. and adding sodium hydroxide flakes having a purity of 99% thereto in the example 1, a wafer was processed under the same condition as that in the example 1.

Example 3

Other than fabricating an alkali etchant composed of a sodium hydroxide solution having weight concentration of 70 wt % by keeping 51 wt % of a sodium hydroxide solution at 80° C. and adding sodium hydroxide flakes having a purity of 99% thereto in the example 1, a wafer was processed under the same condition as that in the example 1.

Example 4

Other than fabricating an alkali etchant composed of a sodium hydroxide solution having weight concentration of 60 wt % by keeping 51 wt % of a sodium hydroxide solution at 90° C. and adding sodium hydroxide flakes having a purity of 99% thereto in the example 1, a wafer was processed under the same condition as that in the example 1.

Example 5

Other than fabricating an alkali etchant composed of a sodium hydroxide solution having weight concentration of 60 wt % by keeping 51 wt % of a sodium hydroxide solution at 85° C. and adding sodium hydroxide flakes having a purity of 99% thereto, a wafer was subjected to processing under the same condition as that in the example 1.

Example 6

Other than fabricating an alkali etchant composed of a sodium hydroxide solution having weight concentration of 60 wt % by keeping 51 wt % of a sodium hydroxide solution at 80° C. and adding sodium hydroxide flakes having a purity of 99% thereto in thee example 1, a wafer was processed under the same condition as that in the example 1.

Example 7

Other than fabricating an alkali etchant composed of a sodium hydroxide solution having weight concentration of 55 wt % by keeping 51 wt % of a sodium hydroxide solution at 90° C. and adding sodium hydroxide flakes having a purity of 99% thereto in the example 1, a wafer was processed under the same condition as that in the example 1.

Example 8

Other than fabricating an alkali etchant composed of a sodium hydroxide solution having weight concentration of 55 wt % by keeping 51 wt % of a sodium hydroxide solution at 85° C. and adding sodium hydroxide flakes having a purity of 99% thereto, a wafer was processed under the same condition as that in the example 1.

Comparative Example 1

Other than keeping the alkali etchant composed of 50 wt % of a sodium hydroxide solution at 90° C. and using the same for performing clouding processing in the example 1, a wafer was processed under the same condition as that in the example 1.

Comparative Example 2

Other than keeping the alkali etchant composed of 50 wt % of a sodium hydroxide solution at 85° C. and using the same for performing clouding processing, a wafer was processed under the same condition as that in the example 1.

Comparative Example 3

Other than keeping the alkali etchant composed of 50 wt % of a sodium hydroxide solution at 80° C. and using the same for performing clouding processing, a wafer was processed under the same condition as that in the example 1.

Comparative Example 4

Other than keeping the alkali etchant composed of 40 wt % of a sodium hydroxide solution at 90° C. and using the same for performing clouding processing in the example 1, a wafer was processed under the same condition as that in the example 1.

Comparative Example 5

Other than keeping the alkali etchant composed of 40 wt % of a sodium hydroxide solution at 85° C. and using the same for performing clouding processing in the example 1, a wafer was processed under the same condition as that in the example 1.

Comparative Example 6

Other than keeping the alkali etchant composed of 40 wt % of a sodium hydroxide solution at 80° C. and using the same for performing clouding processing in the example 1, a wafer was processed under the same condition as that in the example 1.

Comparative Example 7

Other than keeping the alkali etchant composed of 55 wt % of a sodium hydroxide solution at 80° C. and using the same for performing clouding processing, a wafer was processed under the same condition as that in the example 1.

[Gloss Level Lowering Test]

Measurement was made respectively on the wafers obtained in the examples 1 to 8 and comparative examples 1 to 7 as to a gloss level before being subjected to the clouding processing and a gloss level after the clouding processing by a gloss level meter (made by NIPPON DENSHOKU Co., Ltd.) based on the standard of gloss 60°, and the lowering rate (%) was also calculated. Also, front and back of the wafers were observed with eyes to evaluate whether the front and back can be identified or not. Wafers able to be identified were determined to be "o" and wafers unable to be identified were determined to be "x".

Figure 2:
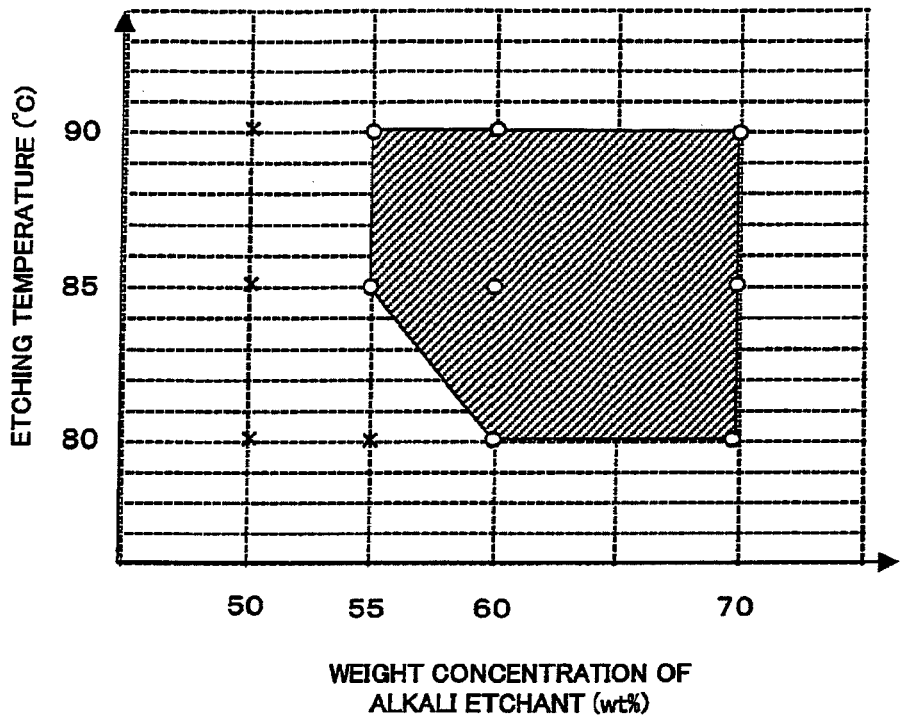
FIG. 2 is a graph showing a capability of identifying front and back in combinations of weight concentration of an alkali etchant and etching (clouding processing) temperature.
Figure 3:
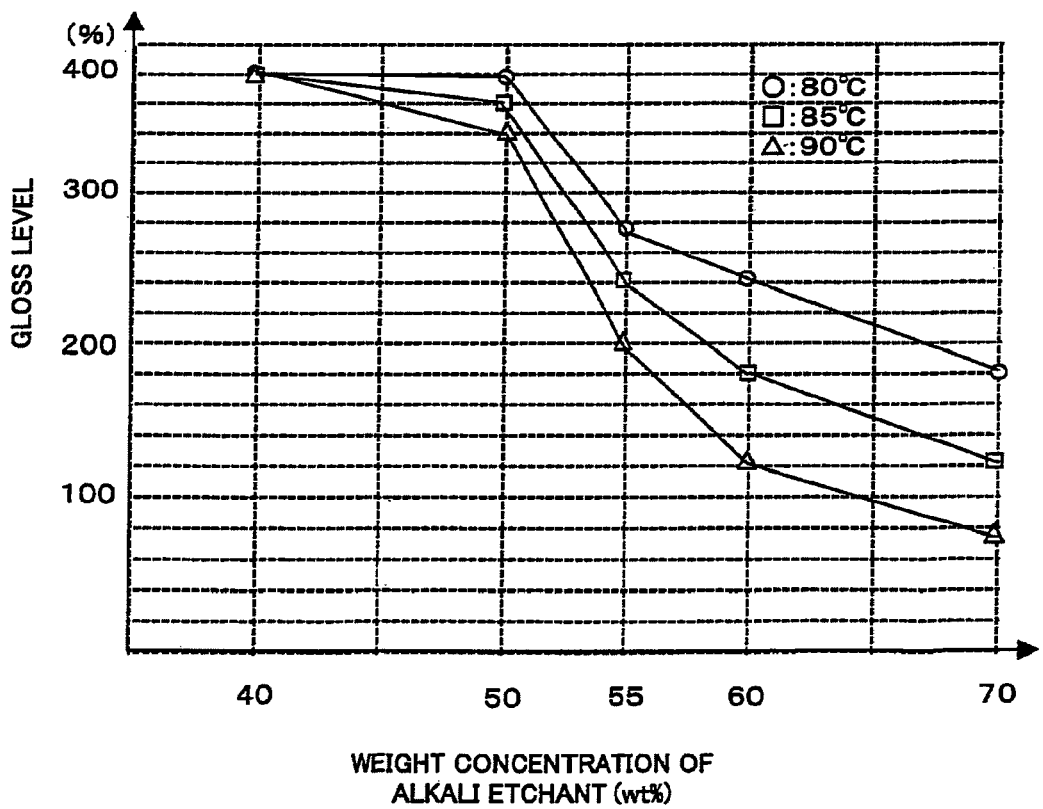
FIG. 3 is a graph showing a gloss level (%) with respect to weight concentration (wt %) of alkali etchant.

The results are shown in Table 1, FIG. 2 and FIG. 3. FIG. 2 is a graph showing whether front and back can be identified or not in combinations of weight concentration of the alkali etchant and the etching (clouding processing) temperature: wherein a "o" mark in the graph indicates a point that identification is possible, while a "x" mark indicates a point that identification is not possible. Also, a hatched field in the figure indicates a range that identification is possible. FIG. 3 is a graph showing a gloss level (%) with respect to weight concentration (wt %) of the alkali etchant.

TABLE 1

|  | Weight Concentration of Sodium Hydroxide (wt %) | Clouding Processing Temperature (° C.) | Lowering Rate of Gloss Level Before and After Clouding Processing | Capability of Identifying Front and Back |
|---|---|---|---|---|
| Example 1 | 70 | 90 | 81 | ○ |
| Example 2 | 70 | 85 | 70 | ○ |
| Example 3 | 70 | 80 | 55 | ○ |
| Example 4 | 60 | 90 | 70 | ○ |
| Example 5 | 60 | 85 | 55 | ○ |
| Example 6 | 60 | 80 | 40 | ○ |
| Example 7 | 55 | 90 | 50 | ○ |
| Example 8 | 55 | 85 | 40 | ○ |
| Comparative Example 1 | 50 | 90 | 15 | X |
| Comparative Example 2 | 50 | 85 | 5 | X |
| Comparative Example 3 | 50 | 80 | 0 | X |
| Comparative Example 4 | 40 | 90 | 0 | X |
| Comparative Example 5 | 40 | 85 | 0 | X |
| Comparative Example 6 | 40 | 80 | 0 | X |
| Comparative Example 7 | 55 | 80 | 31 | X |

From the results of the examples 1 to 8 and comparative examples 1 to 7, a lowering rate of the gloss level has to be at least 40% or so for enabling to identify front and back of the mirror finished wafer with eyes, but it was confirmed that identifying of front and back of the mirror finished wafer with eyes becomes possible when the weight concentration of the alkali etchant is 60 wt % to 70 wt % and the etching temperature is 80° C. to 90° C. Also, it was confirmed that when the weight concentration of the alkali etchant was 55 wt %, identifying of front and back of the mirror finished wafer with eyes becomes possible if the etching temperature is 85° C. to 90° C. Accordingly, it is inferred that a slope has a relation of a minus linear function in a range that the etching temperature is 80 to 85° C. when the weight concentration of the alkali etchant is 55 to 60 wt % as shown in FIG. 2.

Example 9

While keeping 51 wt % of a sodium hydroxide solution at 80° C., sodium hydroxide flakes having a purity of 99% were added thereto, so that an alkali etchant composed of a sodium hydroxide solution having weight concentration of 70 wt % was fabricated. In the alkali etchant kept at 80° C., one surface of a both-side mirror finished silicon wafer subjected to the processing in the steps S1 to S5 shown in FIG. 1 was immersed until an etching depth (allowance) reaches 10 μm. The wafers, wherein one surface was subjected to clouding processing as above, were subjected to pure water washing, neutralizing processing, pure water washing and drying in respective steps of the steps S7 to S10 shown in FIG. 1. As a neutralizing agent in the step S8, a fluorinated acid solution in weight concentration of 10 wt % added with 10 ppm of ozone was used and the processing was performed at a room temperature for 5 minutes.

Example 10

Other than changing an etching depth by the alkali etchant to 20 μm in the example 9, a wafer was processed under the same condition as that in the example 9.

Example 11

Other than changing an etching depth by the alkali etchant to 30 μm in the example 9, a wafer was processed under the same condition as that in the example 9.

Example 12

Other than changing an etching depth by the alkali etchant to 40 μm in the example 9, a wafer was processed under the same condition as that in the example 9.

Comparative Example 8

Other than using an alkali etchant composed of 50 wt % of sodium hydroxide solution in the example 9, a wafer was processed under the same condition as that in the example 9.

Comparative Example 9

Other than using an alkali etchant composed of 50 wt % of sodium hydroxide solution in the example 10, a wafer was processed under the same condition as that in the example 10.

Comparative Example 10

Other than using an alkali etchant composed of 50 wt % of a sodium hydroxide solution in the example 11, a wafer was processed under the same condition as that in the example 11.

Comparative Example 11

Other than using an alkali etchant composed of 50 wt % of a sodium hydroxide solution in the example 12, a wafer was processed under the same condition as that in the example 12.

[Confirmation Test of Global Flatness (GBIR)]

Global flatness level GBIR(TTV) of a wafer before etching (clouding processing) and GBIR after the etching were respectively measured and a change rate thereof was also calculated. A thickness/flatness measurement apparatus (made by Japan ADE Ltd.) having a capacitance type distance sensor was used for measuring flatness level GBIR. Also, the site flatness SFQR and nano-topography (a difference (nm) of the maximum value and minimum value of a height in 2 mm square) were measured.

TABLE 2

|  | Etching Depth (μm) | GBIR Before Etching (μm) | GBIR After Etching (μm) | Change Before and After Etching ΔGBIR (μm) | Change Rate of GBIR (%) | SFQR after Etching (μm) | Nano-topography After Etching (nm) |
| --- | --- | --- | --- | --- | --- | --- | --- |
| Example 9 | 10 | 0.65 | 0.70 | 0.05 | 0.5 | 0.065 | 15 |
| Example 10 | 20 | 0.70 | 1.00 | 0.30 | 1.5 | 0.150 | 30 |
| Example 11 | 30 | 0.60 | 1.50 | 0.90 | 3.0 | 0.205 | >100 |
| Example 12 | 40 | 0.75 | 2.00 | 1.25 | 3.1 | 0.350 | >100 |
| Comparative Example 8 | 10 | 0.60 | 0.95 | 0.35 | 3.5 | 0.175 | 50 |
| Comparative Example 9 | 20 | 0.55 | 1.20 | 0.65 | 3.3 | 0.355 | >100 |
| Comparative Example 10 | 30 | 0.70 | 1.90 | 1.20 | 4.0 | 0.575 | >100 |
| Comparative Example 11 | 40 | 0.80 | 2.50 | 1.70 | 4.3 | 0.700 | >100 |

From the results of the examples 9 to 12 and comparative examples 8 to 12, it was confirmed that a change rate of the global flatness level GBIR can be suppressed to about 3% even when the etching depth is 30 to 40 μm if the weight concentration of the alkali etchant is 70 wt %. Also, the examples 9 to 12 exhibited more preferable values in the site flatness SFQR and nano-topography comparing with those in the comparative examples 8 to 11.

Note that the embodiments explained above are described to facilitate understanding of the present invention and is not to limit the present invention. Accordingly, respective elements disclosed in the above embodiments include all design modifications and equivalents belonging to the technical scope of the present invention.

The invention claimed is:

1. A production method of a semiconductor wafer, comprising:
   producing a semiconductor wafer by slicing a semiconductor ingot;
   wrapping both surfaces of the semiconductor wafer;
   etching both surfaces of the wrapped semiconductor wafer by bringing both surfaces of the wrapped semiconductor wafer in contact with etchant for removing distortion of both surfaces of the wrapped semiconductor wafer;
   mirror polishing both surfaces of the etched semiconductor wafer;
   clouding one surface of the mirror polished semiconductor wafer by bringing the one surface in contact with a sodium hydroxide solution, wherein a temperature is 80° C. to 90° C. and weight concentration is 60 wt % to 70 wt %, or a sodium hydroxide solution, wherein a temperature is 85° C. to 90° C. and weight concentration is 55 wt % to 60 wt % and by etching the one surface of the mirror polished semiconductor wafer for lowering a gloss level of the one surface of the mirror polished semiconductor wafer.

2. The production method of a semiconductor wafer as set forth in claim 1, further comprising:
   neutralizing the one surface of the clouded semiconductor wafer by an acid solution after clouding.

3. The production method of a semiconductor wafer as set forth in claim 2, wherein said acid solution contains ozone.

4. The production method of a semiconductor wafer as set forth in claim 2, further comprising:
   bringing the one surface of the neutralized semiconductor wafer in contact with an ozone solution after neutralizing.

* * * * *